United States Patent
Park et al.

(10) Patent No.: US 6,509,774 B2
(45) Date of Patent: Jan. 21, 2003

(54) DELAY CIRCUIT USING CURRENT SOURCE

(75) Inventors: Jung-Woo Park, Seoul (KR); Nam-Seog Kim, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/899,626

(22) Filed: Jul. 5, 2001

(65) Prior Publication Data

US 2002/0093370 A1 Jul. 18, 2002

(30) Foreign Application Priority Data

Dec. 8, 2000 (KR) .............................. 00-74595

(51) Int. Cl.[7] .............................................. H03H 11/26
(52) U.S. Cl. ........................ 327/262; 327/538; 327/161
(58) Field of Search ................................ 327/153, 158, 327/161, 262, 162, 263, 538, 540, 541, 543

(56) References Cited

U.S. PATENT DOCUMENTS 5,731,727 A * 3/1998 Iwamoto et al. ............ 327/158
6,064,275 A * 5/2000 Yamauchi ................... 327/534
6,178,123 B1 * 1/2001 Kato et al. .................. 327/158
6,188,637 B1 * 2/2001 Ooishi .................... 365/189.07
6,249,176 B1 * 6/2001 Pease ......................... 323/312

* cited by examiner

Primary Examiner—Timothy P. Callahan
Assistant Examiner—Linh Nguyen
(74) Attorney, Agent, or Firm—F. Chau & Associates, LLP

(57) ABSTRACT

A delay circuit having a constant period of delay time independent of changes in operations, temperature and voltage includes a current source for generating a constant current and having PMOS transistors of which gates are commonly connected, wherein the constant current is controlled by sizes of the PMOS transistors; and a unit delay circuit including a CMOS inverter having PMOS and NMOS transistors, wherein non-adjacent PMOS and NMOS transistors are controlled to charge and discharge current when a constant level of the constant current is transmitted from the current source and other adjacent PMOS and NMOS transistors are switched to connect or disconnect a current path through which the current is charged or discharged.

16 Claims, 5 Drawing Sheets

US 6,509,774 B2

DELAY CIRCUIT USING CURRENT SOURCE

BACKGROUND OF THE INVENTION

1. Field of the Invention

The present invention relates to a delay circuit, and more particularly, to a delay circuit having a constant period of delay, substantially independent of changes in environmental factors such as operations, temperature and voltage.

2. Description of the Related Art

With a recent trend of high-density integration and high-speed operations of semiconductor memory devices, delay circuits become more important. One of the important factors to be considered in designing a delay circuit is that there should not be a change in delay time influenced by any external environment factors. If there is a change in delay time of the delay circuit by any external factors, it may be difficult for internal circuits to perform normal operations, and internal circuits cannot operate to the maximum level of functions.

Delay circuits have been developed to be used for semiconductor memory devices. The conventional delay circuits are typically developed based on theoretical basis without taking into account external environmental influences such as temperature and voltage variations. These conventional delay circuits have problems from variations due to changes in environmental factors such as operations, temperature and voltage.

FIG. 1 illustrates a conventional delay circuit. The conventional delay circuit shown in FIG. 1 is constructed with complementary metal oxide semiconductor (CMOS) inverters. In the conventional delay circuit, if there is a change in voltage Vcc or temperature, there will be changes in the current flow through the delay circuit, making difficult for the delay circuit to have a constant period of delay time as desired.

A delay circuit having a constant period of delay time independent of changes in external environmental factors has been proposed, for example, in U.S. Pat. No. 5,453,709. FIGS. 2 through 4 illustrate the aforementioned delay circuit. FIG. 2 is a circuit diagram illustrating a conventional CMOS delay circuit having a constant period of delay time. The delay circuit includes first and second compensation circuits 1 and 2 for compensating changes in the environmental factors in the components of the delay circuit.

FIGS. 3 and 4 respectively illustrate the first and second compensation circuits 1, 2 of FIG. 2. The main principle of the delay circuit having a constant period of delay time disclosed in U.S. Pat. No. 5,453,709 is to make a period of delay time constant by using a compensation method in which the first compensation circuit 1 and second compensation circuit 2 serve to track down changes in threshold voltage and/or temperature of PMOS and NMOS transistors respectively constructed at the top/bottom ends of chains of CMOS inverters, thereby adaptively changing the current of PMOS and NMOS transistors constructed at top/bottom end of the chain of CMOS inverters.

In FIG. 3, reference symbol CE indicates a chip enabling signal, which will turn to a high state when the chip is in operation. For instance, if the threshold voltage Vth of NMOS reduces due to operational changes, current of NMOS transistor n7 increases to drop the level of an output NO. Then, voltage Vgs of NMOS transistors n14, n1, n18 and n20 (referring to FIG. 2) is reduced to compensate the reduction in the threshold voltage Vth of the transistors n14, n16, n18 and n20. In contrast, if the threshold voltage Vth increases, the level of the output NO increases to compensate the increase in the threshold voltage Vth. Also, if temperature increases, current of the transistor n7 is reduced to increase the level of the output NO. When temperature increases, the value of resistor RI increases to drop the level of the output NO. However, the reduction in the current of the transistor n7 is bigger than the increase in the resistance value of the resistor RI, so that the level of the output NO increases as temperature increases. The increase in the level of the output NO compensates the reduction in the current of the transistors n14, n16, n18 and n20 caused by the increase in temperature.

Likewise, the delay circuit is designed to have a constant period of delay time by compensating the changes caused by external environmental factors in the operational process of the second compensation circuit shown in FIG. 4, so that the delay circuit has a fixed period of delay time as disclosed in U.S. Pat. No. 5,453,709.

There is a disadvantage in the conventional delay circuit having a fixed period of delay time disclosed, for example, in U.S. Pat. No. 5,453,709 in that it is difficult to construct the delay circuit and to adjust the range of compensation in the compensation circuit using a tracking method.

SUMMARY OF THE INVENTION

It is an object of the present invention to provide a delay circuit that has a constant period of delay time by preventing a change in the delay time due to external environmental factors such as operations, temperature and voltage.

To accomplish the aforementioned and other objects of the present invention, there is provided a delay circuit having a constant delay time which includes a current source having metal oxide semiconductor (MOS) transistors of which gates are connected to each other, the current source generating a constant current by controlling sizes of the MOS transistors; and a unit delay circuit having a complementary MOS (CMOS) inverter with p-channel MOS (PMOS) transistors and n-channel MOS (NMOS) transistors, wherein non-adjacent PMOS and NMOS transistors are controlled to charge or discharge current when a constant level of the constant current is transmitted from the current source and other adjacent PMOS and NMOS transistors are switched to connect or disconnect a current path through which the current is charged or discharged.

Preferably, the current source of the delay circuit includes a supply voltage being connected with respective sources of first through fourth PMOS transistors, wherein gates of the first through fourth PMOS transistors are commonly connected with an output of a comparator, a drain of the first PMOS transistor is connected with a first voltage and a diode, and a drain of the second PMOS transistor is connected with a second voltage and a resistor; the resistor being connected to diodes connected to each other in parallel having a third voltage; and the fourth PMOS transistor having a drain connected to a drain of the third PMOS transistor, wherein the constant current output from the drain of the third PMOS transistor is supplied to the unit delay circuit.

The delay circuit of the present invention may also include a current mirror for mirroring a certain level of the constant current output from the current source and for transmitting the certain level of the constant current to the non-adjacent PMOS and NMOS transistors in the unit delay circuit.

These and other objects, features and advantages of the present invention will become apparent from the following detailed description of illustrative embodiments thereof, which is to be read in connection with the accompanying drawings.

BRIEF DESCRIPTION OF THE DRAWINGS

For a full understanding of the nature and objects of the invention, reference should be made to the following detailed description taken in conjunction with the accompanying drawings in which.

DETAILED DESCRIPTION OF PREFERRED EMBODIMENTS

Figure 1:
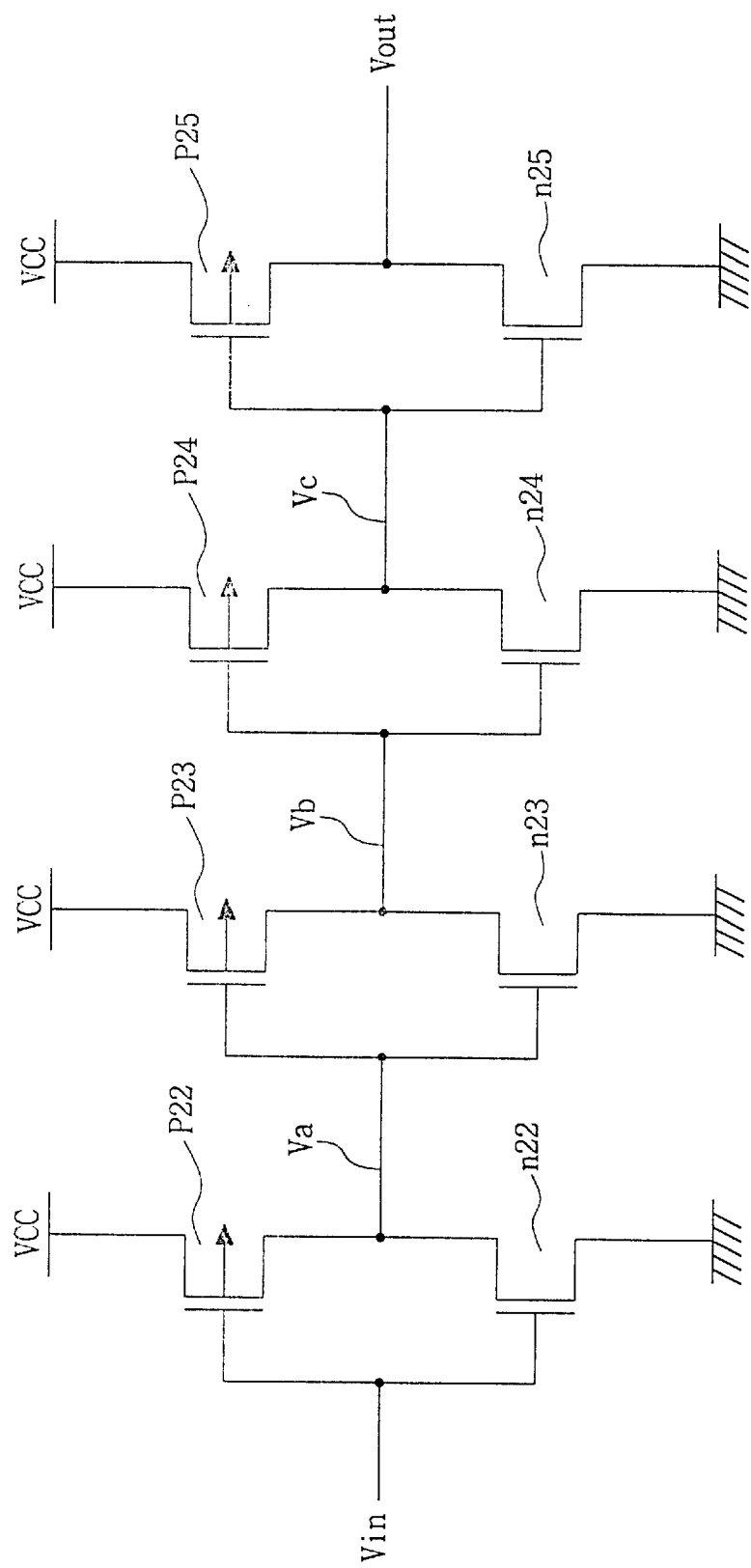
FIG. 1 is a circuit diagram illustrating a conventional delay circuit.
Figure 2:
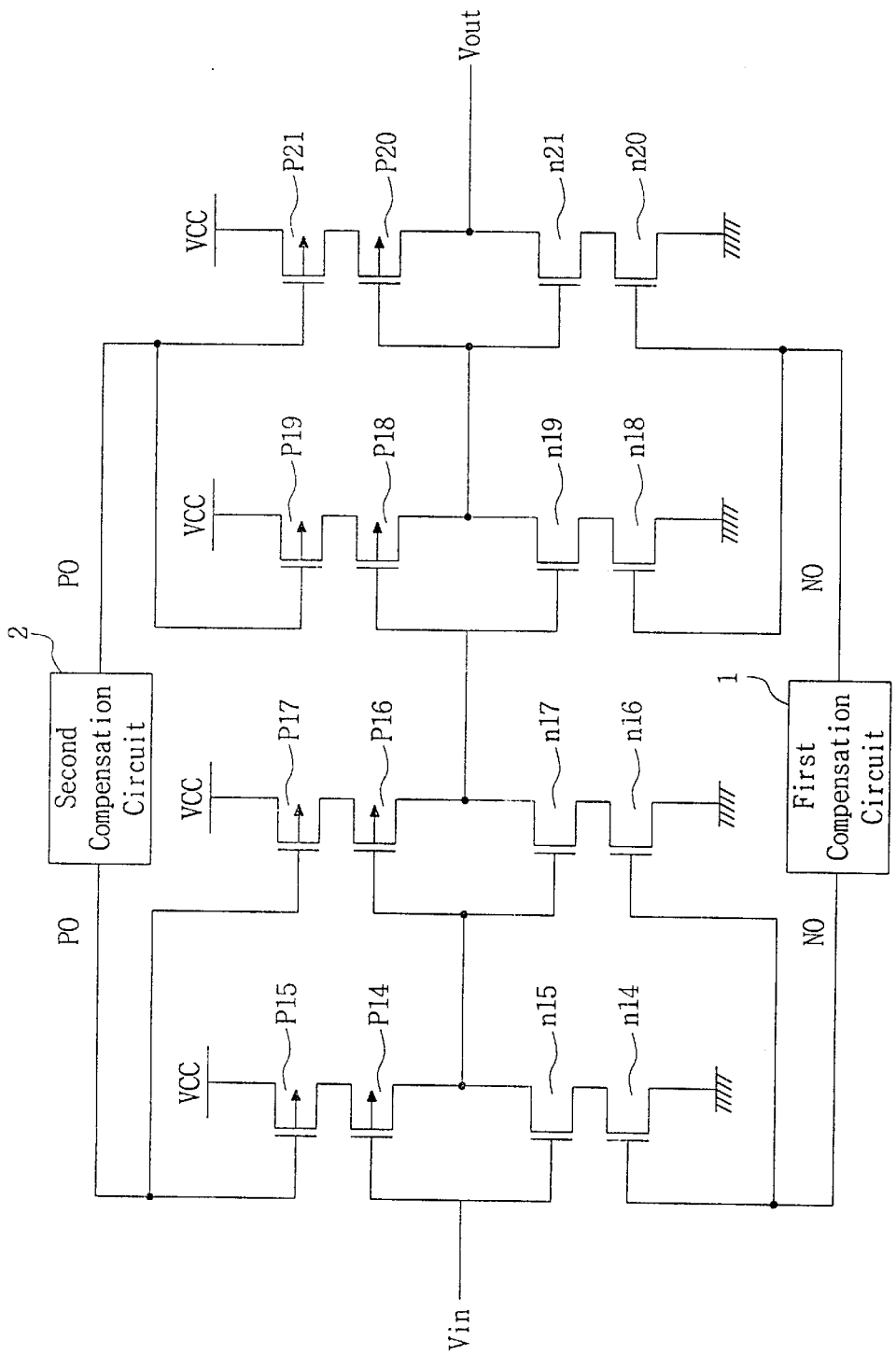
FIG. 2 is a circuit diagram illustrating another conventional delay circuit.
Figure 3:
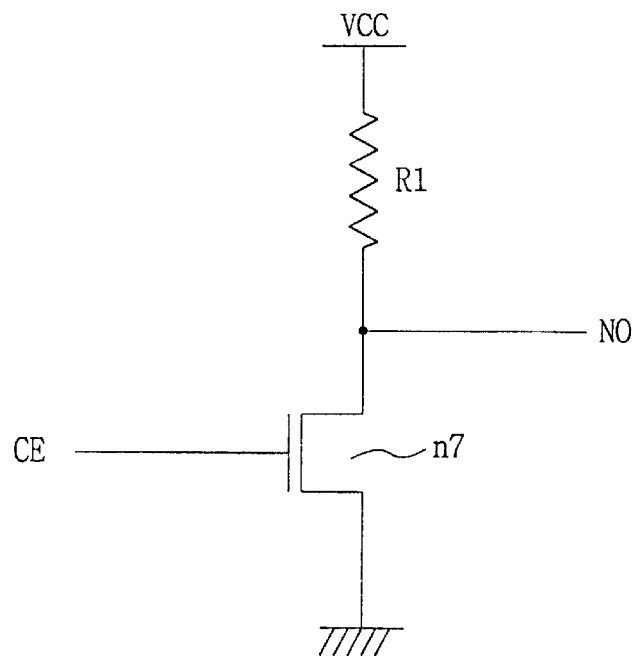
FIG. 3 is a circuit diagram illustrating a first compensation circuit of FIG. 2.
Figure 4:
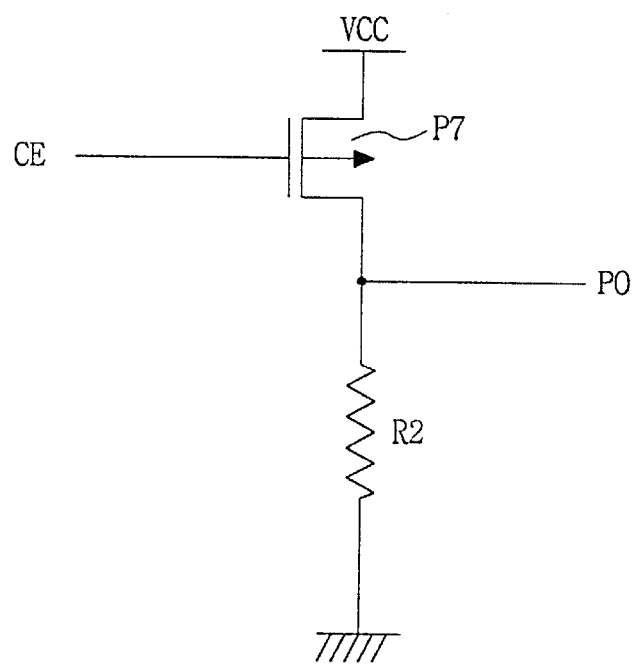
FIG. 4 is a circuit diagram illustrating a second compensation circuit of FIG. 2.

The objects and characteristics of the present invention will become apparent from the following detailed description of preferred embodiments with reference to the accompanying drawings. Throughout the drawings, it should be noted that the same reference numerals are used for designation of like portions for simplicity of illustration and explanation and for convenience of description and understanding. Detailed description about well-known functions and structure is omitted.

Figure 5:
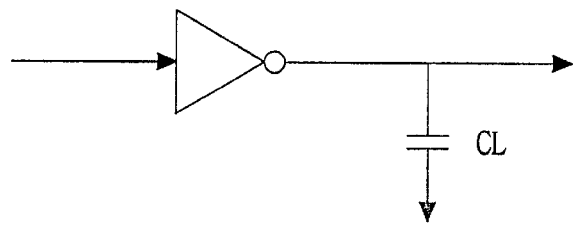
FIG. 5 is a circuit diagram illustrating a typical CMOS inverter.

FIG. 5 is a circuit diagram for illustrating a typical complementary metal oxide semiconductor (CMOS) inverter having a delay time. The delay time ($\tau_{pd}$) of the CMOS inverter in FIG. 5 can be expressed by the following mathematical formula 1:

$$\tau_{pd} C_L \cdot (VDD)/I_{av} \quad \text{Formula 1:}$$

where, if voltage VDD is substantially constant and current I flowing to the inverter is irrelevant to environmental factors such as operations, supply voltage and temperature, the delay time remains constant. The concept of the constant period of delay time obtained by using the constant current independent of the environmental factors is implemented in the present invention.

Figure 6:
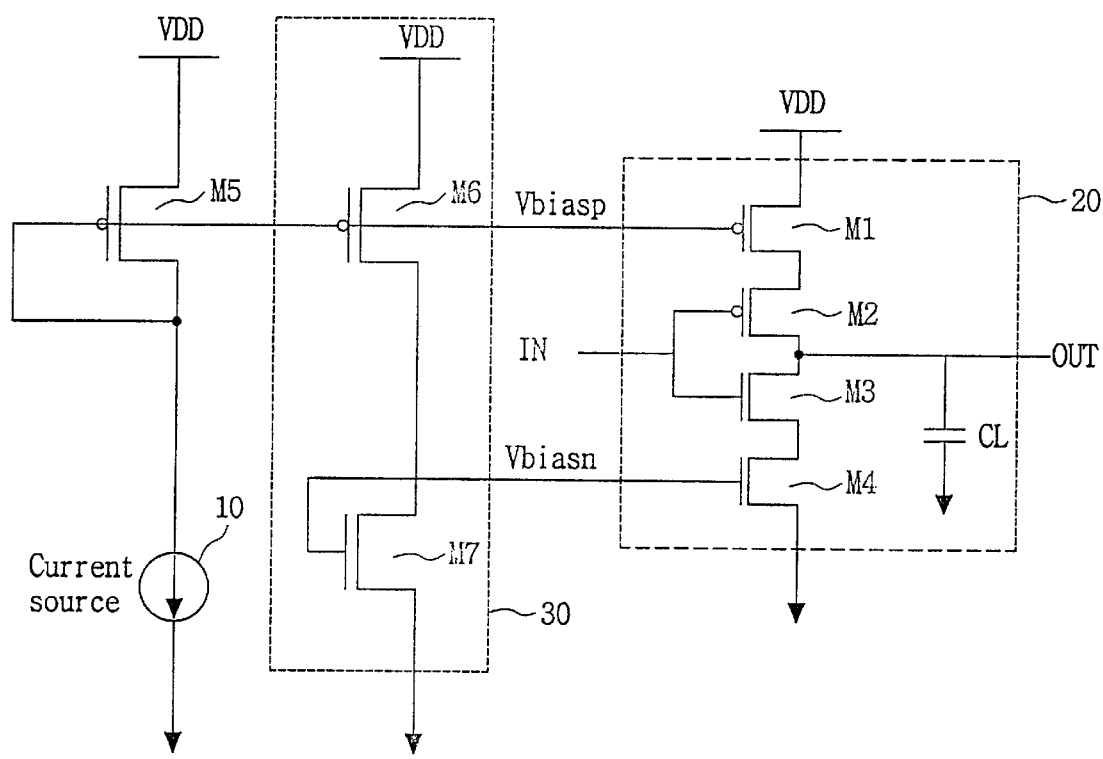
FIG. 6 is a circuit diagram illustrating a preferred embodiment of a delay circuit in accordance with the present invention.

FIG. 6 is a circuit diagram of a delay circuit having a constant delay time according to a preferred embodiment of the present invention. The delay circuit includes a current source 10, a current mirror 30 and a unit delay circuit 20. The current source 10 generates current independent of the environmental factors such as operations, temperature and voltage. The current mirror 30 mirrors a constant level of the current output from the current source 10 and transmits it to the unit delay circuit 20. By mirroring the constant level of the current, the current mirror 30 provides bias voltage signals Vbiasn, Vbiasp. The unit delay circuit 20 is preferably a CMOS inverter to be used for a current starved inverter that achieves variable delay at an initial delay-locked loop (DLL). In this inverter, the variable delay is made by controlling the bias voltage signals Vbiasn and Vbiasp.

The unit delay circuit 20 preferably has two p-channel metal oxide semiconductor (PMOS) transistors M1, M2, two n-channel metal oxide semiconductor (NMOS) transistors M3, M4 which are connected between a supply voltage and a ground, and a capacitor CL which are connected between the two NMOS transistors M3, M4 and output terminal OUT.

The adjacent transistors M2 and M3 are used as a switch to open/close (or connect or disconnect) a current path through which the current is charged or discharged.

When the current source 10 generates the constant current irrelevant to operations, temperature and voltage, the current is mirrored to flow to the transistors M1 and M4. As a result, the unit delay circuit 20 is delayed for a constant period of delay time. Thus, the operation of the current source 10 which generates the constant current irrelevant to the operations, temperature and voltage, is very important to the delay circuit. A preferred embodiment of the current source 10 is shown in FIG. 7.

Figure 7:
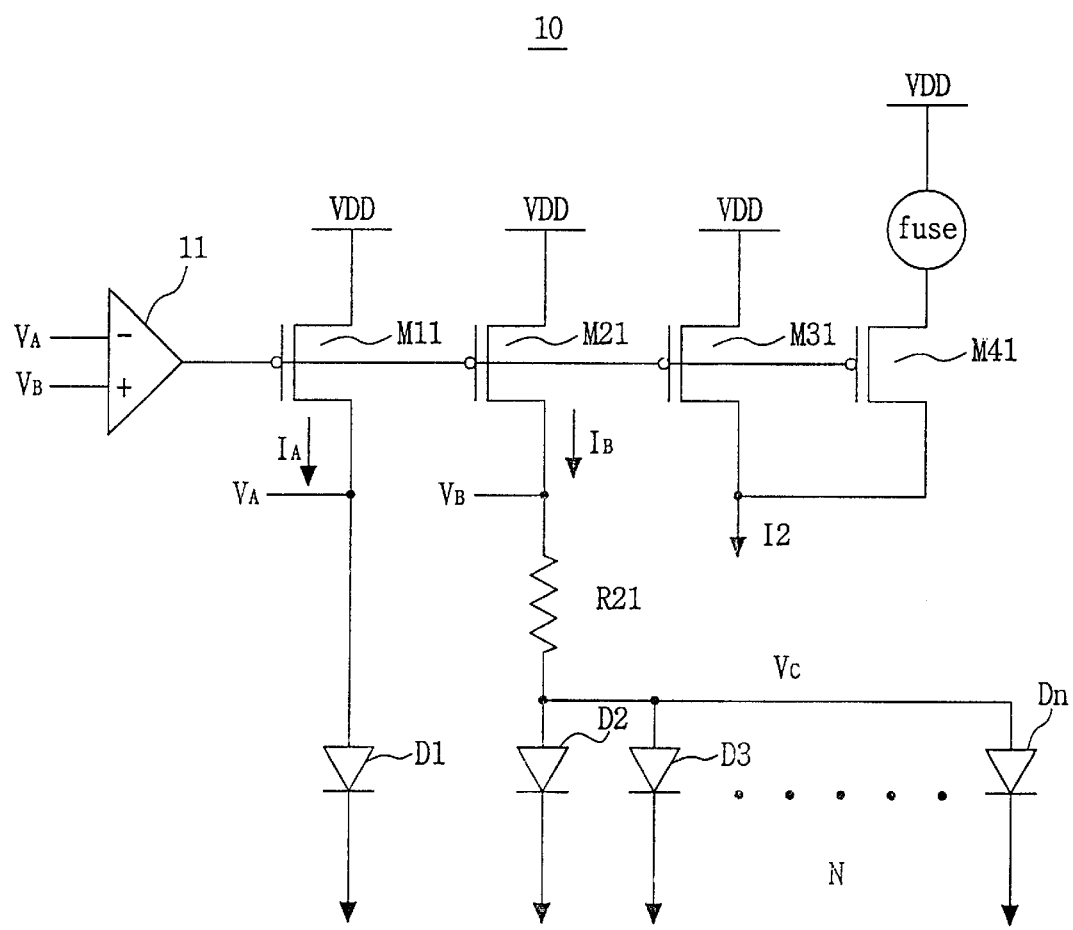
FIG. 7 is a circuit diagram illustrating a preferred embodiment of a current source in the delay circuit in accordance with the present invention.

FIG. 7 shows a circuit diagram illustrating a preferred embodiment of the current source 10 in FIG. 6. The current source 10 generates the constant current independent of the environmental factors, such as operations, supply voltage and temperature, to be used in the delay circuit in FIG. 6. The structure and operation of the current source 10 will be described below with reference to FIG. 7.

Supply voltage VDD is connected to respective sources of PMOS transistors M11, M21, M31, M41. Gates of the transistors M11, M21, M31, M41 are interconnected from one another. Drain of the transistor M11 is connected to voltage $V_A$ and diode D1. A drain of the transistor M21 is connected to voltage $V_B$ and resistor R21. The resistor R21 is connected to a plurality of diodes D2 through Dn which are connected to each other in parallel and have voltage $V_C$. Current I2 output from a drain of the transistor M31 is supplied to the delay circuit shown in FIG. 6. Also, a drain of the transistor M41 is connected to the drain of the transistor M31. A fuse is connected between the supply voltage VDD and the source of the transistor M41. The gates of the transistors M11, M21, M31, M41 are connected to an output of the comparator 11. The PMOS transistors M11, M21 preferably have sizes different from each other to easily control current. In addition, the fuse may be shut off to control the quantity of current to be supplied, so that trimming may be performed with respect to the current.

The current $I_2$ output from the current source 10 is obtained by the following mathematical formula 2.

Formula 2:

$$I_2 = I_B = (V_B - V_C)/R_{21} = 1/R_{21} \cdot \{V_T \cdot \ln(I_A/I_B) - V_T \cdot \ln\{(I_B/N)I_B\} =$$
$$\{V_T \cdot \ln(N \cdot I_A/I_B)\}/R_{21} = \{V_T \cdot \ln(N \cdot W_{M11}/W_{M21})\}/R_{21}$$

where, "$I_A/I_B$" is determined by the ratio of the transistors M11 and M21; "$W_{M11}$" and "$W_{M21}$" indicate the respective size of the transistors M11 and M21; and "$V_T$" is kT/q, indicating a property that the voltage increases relevantly to temperature. Therefore, "ln (N·$W_{M11}/W_{M21}$)" can be controlled to make the current I2 independent of temperature. It should be noted that the current can also be controlled by changing the number of diodes.

Therefore, the delay circuit of the present invention has a constant period of delay time by using the constant current flowing to the unit delay circuit 20, which is generated from the current source 10 to have a constant level. The delay circuit of the present invention can be used for sampling data by delaying a clock signal when the clock signal and data signal are input to memory in the same phase without a phase difference of 90°.

While the invention has been described in terms of preferred embodiments, those skilled in the art will recognize that modifications can be made within the spirit and scope of the present invention. Thus, the scope of the present invention should not be limited to the aforementioned embodiments, but extended to the appended claims and equivalents to those claims.

As described above, there are advantages in the delay circuit of the present invention. For example, since the delay circuit is constructed to obtain a constant period of delay time irrelevant to operations, temperature and voltage, internal circuits can perform normal operations and function to the maximum level thereof.

What is claimed is:

1. A delay circuit comprising:
    a current source having metal oxide semiconductor (MOS) transistors of which gates are connected to each other, the current source generating a constant current by controlling sizes of the MOS transistors; and
    a unit delay circuit having a complementary MOS (CMOS) inverter with p-channel MOS (PMOS) transistors and n-channel MOS (NMOS) transistors, wherein non-adjacent PMOS and NMOS transistors are controlled to charge or discharge current when a constant level of the constant current is transmitted from the current source and other adjacent PMOS and NMOS transistors are switched to connect or disconnect a current path through which the current is charged or discharged,
    wherein the current source comprises:
    a supply voltage being connected with respective sources of first through fourth PMOS transistors, gates of the first through fourth PMOS transistors being commonly connected with an output of a comparator, a drain of the first PMOS transistor being connected with a first voltage and a diode, and a drain of the second PMOS transistor being connected with a second voltage and a resistor;
    the resistor being connected to diodes connected to each other in parallel having a third voltage; and
    the fourth PMOS transistor having a drain connected to a drain of the third PMOS transistor,
    wherein the constant current output from the drain of the third PMOS transistor is supplied to the unit delay circuit.

2. The delay circuit as defined in claim 1, wherein the current source includes a fuse connected between a supply voltage and a source of the fourth PMOS transistor, quantity of the constant current being controlled by cutting the fuse.

3. The delay circuit as defined in claim 1, wherein the constant current is determined by the following mathematical formula:

$$\text{constant current} = \{V_T \cdot \ln(N \cdot W_{M11}/W_{M21})\}/R_{21}$$

where, $V_T = kT/q$; N represents a number of the diodes connected to the resistor; $W_{M11}$ and $W_{M21}$ represent respective sizes of the first and second PMOS transistors in the current source; and $R_{21}$ represents a resistance value of the resistor.

4. The delay circuit as defined in claim 1, wherein the current source controls the constant current by changing the sizes of the first and second PMOS transistors or the number of the diodes.

5. The delay circuit as defined in claim 1, additionally comprising a current mirror for mirroring a certain level of the constant current output from the current source and for transmitting the certain level of the constant current to the non-adjacent PMOS and NMOS transistors in the unit delay circuit.

6. A delay circuit comprising:
    a current source including first through fourth PMOS transistors of which sources are connected to a supply voltage and gates are commonly connected with an output of a comparator, a drain of the first PMOS transistor being connected with a first voltage and a diode, a drain of the second PMOS transistor being connected with a second voltage and a resistor, the resistor being connected to diodes connected to each other in parallel having a third voltage, a drain of the fourth PMOS transistor being connected to a drain of the third PMOS transistor, and a current output from the drain of the third PMOS transistor being a constant current having a constant level which is controlled by sizes of the PMOS transistors;
    a current mirror for mirroring the constant level of the current output from the current source; and
    a unit delay circuit including a CMOS inverter having two PMOS transistors and two NMOS transistors, wherein non-adjacent PMOS and NMOS transistors are controlled to charge and discharge current when the constant level of the current is transmitted from the current source and other adjacent PMOS and NMOS transistors are switched to connect or disconnect a current path.

7. The delay circuit as defined in claim 6, wherein the current source controls the constant current by cutting a fuse to trim quantity of the constant current.

8. The delay circuit as defined in claim 6, wherein the constant current is determined by the following mathematical formula:

$$\text{constant current} = \{V_T \cdot \ln(N \cdot W_{M11}/W_{M21})\}/R_{21}$$

where, $V_T = kT/q$; N represents a number of the diodes connected to the resistor; $W_{M11}$ and $W_{M21}$ represent respective sizes of the first and second PMOS transistors; and $R_{21}$, represents a resistance value of the resistor.

9. A delay circuit for having a constant delay time, comprising:
    a current source for generating a constant current which is independent of environmental factors including temperature;
    a current mirror for mirroring a constant level of the constant current to provide bias voltage signals; and
    a delay unit for delaying an input signal for the constant delay time by charging or discharging current in response to the bias voltage signals, wherein the delay unit includes a first set of transistors for forming a current path for the charging or discharging and being gated by the bias voltage signals, and a second set of transistors being gated by the input signal to connect or disconnect the current path,
    wherein the current source includes:
    a comparator for comparing input signals received via first and second inputs to generate an output signal;
    a first transistor having a conduction path between a supply voltage and the first input of the comparator and being gated by the output signal of the comparator;
    a second transistor having a conduction path between the supply voltage and the second input of the comparator and being gated by the output signal of the comparator; and a third transistor having a conduction path between the supply voltage and an output terminal to generate the constant current and being gated by the output signal of the comparator.

10. The delay circuit as defined in claim 9, wherein the current source further includes a fuse connected between the supply voltage and the third transistor, the constant current being controlled by cutting the fuse.

11. The delay circuit as defined in claim 10, wherein the current source further includes a plurality of diodes connected in parallel between the second transistor and ground, the constant current being controlled by a number of the diodes.

12. The delay circuit as defined in claim 9, wherein the first and second transistors in the current source have sizes different from each other, the constant current varying in response to a ratio of the sizes of the first and second transistors.

13. The delay circuit as defined in claim 9, wherein the first set of transistors in the delay unit includes a PMOS transistor and an NMOS transistor connected in serial to form a conduction path between a supply voltage and ground, the PMOS and NMOS transistors being gated by the respective bias voltage signals.

14. The delay circuit as defined in claim 13, wherein the second set of transistors in the delay unit includes a PMOS transistor and an NMOS transistor connected in serial to form a conduction path between the PMOS and NMOS transistors of the first set, the PMOS and NMOS transistors of the second set being gated by the input signal to connect or disconnect the conduction path formed by the first set of transistors.

15. The delay circuit as defined in claim 14, wherein the delay unit further includes a capacitor connected between the conduction path formed by the second set of transistors and an output terminal of the delay unit.

16. The delay circuit as defined in claim 13, wherein the current mirror includes:
   a first PMOS transistor having a conduction path between the supply voltage and the current source and a gate connected to the current source;
   a second PMOS transistor having a conduction path between the supply voltage and the ground and a gate connected to the gate of the first PMOS transistor and a gate of the PMOS transistor of the first set of transistors of the delay unit; and
   a first NMOS transistor having a conduction path between the second PMOS transistor and the ground and a gate connected to a gate of the NMOS transistor of the first set of transistors of the delay unit.

* * * * *